United States Patent
Nakagami

(10) Patent No.: US 12,120,870 B2
(45) Date of Patent: Oct. 15, 2024

(54) SEMICONDUCTOR DEVICE AND METHOD FOR MANUFACTURING SEMICONDUCTOR DEVICE

(71) Applicant: KIOXIA CORPORATION, Tokyo (JP)

(72) Inventor: Kohei Nakagami, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 489 days.

(21) Appl. No.: 17/466,213

(22) Filed: Sep. 3, 2021

(65) Prior Publication Data

US 2022/0189979 A1 Jun. 16, 2022

(30) Foreign Application Priority Data

Dec. 15, 2020 (JP) ................... 2020-207657

(51) Int. Cl.
*H10B 41/41* (2023.01)
*H10B 41/27* (2023.01)
(Continued)

(52) U.S. Cl.
CPC ............ *H10B 41/41* (2023.02); *H10B 43/40* (2023.02); *H10B 41/27* (2023.02); *H10B 43/27* (2023.02)

(58) Field of Classification Search
CPC ........ H10B 41/27; H10B 41/41; H10B 43/40; H10B 43/35; H10B 43/27; H01L 21/76205–7621; H01L 21/76224–76237; H01L 21/76283–76286; H01L 21/7846; H01L 21/76232; H01L 21/823481; H01L 21/823878; H01L 21/823493; H01L 21/823892; H01L 27/092; H01L 27/11568; H01L 27/11573; H01L 27/11526; H01L 27/1203–1211; H01L 29/0649–0653; G11C 5/063; G11C 16/0483
(Continued)

(56) References Cited

U.S. PATENT DOCUMENTS 6,034,388 A 3/2000 Brown et al.
6,693,008 B1 * 2/2004 Sato ...................... H01L 27/105
257/E27.081

(Continued)

FOREIGN PATENT DOCUMENTS

| JP | 2006229014 A | 8/2006 |
| JP | 2014038952 A | 2/2014 |
| TW | 201735260 A | 10/2017 |

*Primary Examiner* — Natalia A Gondarenko
(74) *Attorney, Agent, or Firm* — Kim & Stewart LLP

(57) ABSTRACT

According to one embodiment, a semiconductor device includes a first region including a memory cell and a second region including a peripheral circuit. The second region includes a diffusion region provided on a surface of the semiconductor layer, a gate insulating film provided on the diffusion region, a gate electrode provided on the gate insulating film, an insulator layer provided on the diffusion region and surrounding the gate electrode, and an element isolation that is embedded in the semiconductor layer and surrounds the diffusion region. The element isolation includes a first region that is recessed below the surface of the diffusion region and a second region that is between the diffusion region and the first region and includes a protrusion protruding to a level higher than the first region.

20 Claims, 15 Drawing Sheets

(51) Int. Cl.
*H10B 43/27* (2023.01)
*H10B 43/40* (2023.01)

(58) Field of Classification Search
USPC ............... 257/295, 510, 514, 396, 100, 84;
438/256, 253, 296, 197, 238
See application file for complete search history.

(56) References Cited

U.S. PATENT DOCUMENTS

| | | |
|---|---|---|
| 2014/0051222 A1 | 2/2014 | Terahara et al. |
| 2016/0163718 A1 | 6/2016 | Park et al. |
| 2017/0200726 A1 | 7/2017 | Tsuda et al. |
| 2018/0122819 A1* | 5/2018 | Shim ..................... H10B 43/50 |
| 2019/0348439 A1 | 11/2019 | Yamamoto |
| 2020/0144280 A1 | 5/2020 | Chen et al. |

* cited by examiner

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2020-207657, filed Dec. 15, 2020, the entire contents of which are incorporated herein by reference.

FIELD

Embodiments described herein relate generally to a semiconductor device and a method for manufacturing semiconductor device.

BACKGROUND

A semiconductor device integrating a peripheral circuit and a memory cell array is known. The peripheral circuit typically includes a field effect transistor.

DETAILED DESCRIPTION

Figure 1:
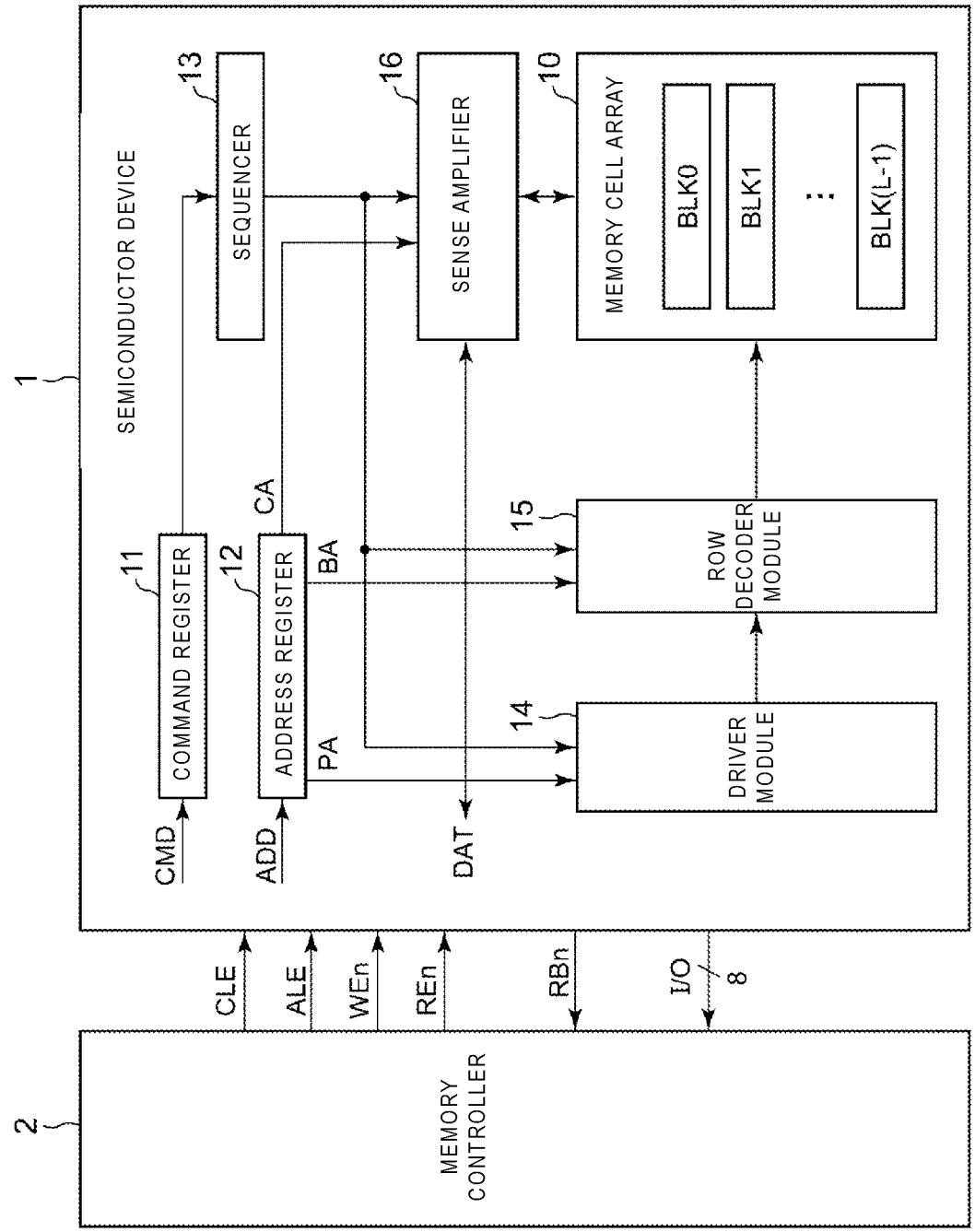
FIG. 1 is a block diagram showing an overall configuration of a semiconductor storage device.

Embodiments provide a semiconductor device having high reliability.

In general, according to one embodiment, a semiconductor device includes a first region including a memory cell and a second region including a peripheral circuit. The second region has a diffusion region that is at a surface of a semiconductor layer, a gate insulating film on a surface of the diffusion region, a gate electrode on the gate insulating film, an insulator layer on the surface of the diffusion region and a side surface of the gate electrode, the insulator layer surrounding the gate electrode, and an element isolation that is embedded in the semiconductor layer and surrounds the diffusion region. The element isolation has a first portion that is recessed to a level lower than the surface of the diffusion region and a second portion that is between the diffusion region and the first region and includes a protrusion that protrudes above the level of the first portion.

Hereinafter, certain example embodiments will be described with reference to the drawings. In general, the depicted relationships between dimensions (e.g., thicknesses, widths, etc.) of each component in the drawings may differ from an actual product. In addition, in the depicted embodiments, the components which are substantially the same are denoted by the same reference symbols, and description thereof will be omitted as appropriate from subsequent descriptions of figures and/or embodiments.

FIG. 1 is a block diagram showing an overall configuration of a semiconductor storage device. A semiconductor device 1 is controlled by a memory controller 2. The semiconductor device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLK(L−1) (where L is an integer equal to or greater than 2). Each block BLK is an aggregate of a plurality of memory cell transistors (hereinafter, referred to as "memory cells") that store data in a nonvolatile manner. The block BLK is, for example, a minimum data erasing unit. The memory cell array 10 is provided with a plurality of bit lines and a plurality of word lines. Each memory cell transistor is associated with, for example, one bit line and one word line.

The command register 11 is capable of storing a command CMD received from the memory controller 2. The command CMD includes, for example, an instruction that causes the sequencer 13 to execute a read operation, a write operation, an erase operation, or the like. The address register 12 is capable of storing address information ADD received from the memory controller 2. The address information ADD includes, for example, a block address BA, a page address PA, and a column address CA. For example, the block address BA, the page address PA, and the column address CA are used to select a particular block BLK, word line, and bit line, respectively.

The sequencer 13 controls an overall operation of the semiconductor device 1. For example, the sequencer 13 controls the driver module 14, the row decoder module 15, the sense amplifier module 16, or the like based on the command CMD stored in the command register 11, and executes the read operation, the write operation, the erase operation, or the like.

The driver module 14 generates voltages used in the read operation, the write operation, the erase operation, or the like. Then, the driver module 14 applies the generated voltage(s) to a signal line corresponding to a selected word line based on, for example, the page address PA stored in the address register 12.

The row decoder module 15 selects a corresponding block BLK in the memory cell array 10 based on the block address BA stored in the address register 12. Then, for example, the row decoder module 15 transfers the voltage applied to the signal line corresponding to the selected word line to the selected word line in the selected block BLK.

In the write operation, the sense amplifier module 16 applies a voltage to bit lines according to write data DAT received from the memory controller 2. In the read operation, the sense amplifier module 16 determines data stored in a memory cell based on a voltage of the bit line or a current flowing through the bit line, and transfers a determination (reading) result to the memory controller 2 as read data DAT.

Communication between the semiconductor device 1 and the memory controller 2 supports, for example, a NAND interface protocol or the like. For example, in the communication between the semiconductor device 1 and the memory controller 2, a command latch enable signal CLE, an address latch enable signal ALE, a write enable signal WEn, a read enable signal REn, a ready busy signal RBn, and an input and output signal I/O are used.

The command latch enable signal CLE is a signal indicating that the input and output signal I/O received by the semiconductor device 1 is the command CMD. The address latch enable signal ALE is a signal indicating that the signal I/O received by the semiconductor device 1 is the address information ADD. The write enable signal WEn is a signal used to control data input from the input and output signal I/O. The read enable signal REn is a signal used to control data output from the input and output signal I/O.

The ready busy signal RBn is a signal that notifies the memory controller 2 of whether the semiconductor device 1 is in a ready state (a state in which an instruction from the memory controller 2 can be received) or in a busy state (a state in which an instruction cannot be received).

The input and output signal I/O is, for example, a signal having an 8-bit width, and may include the command CMD, the address information ADD, the data DAT, or the like.

The semiconductor device 1 and the memory controller 2 may together form a semiconductor storage device by a combination thereof. Examples of such a semiconductor storage device include a memory card or a solid-state drive (SSD).

Figure 2:
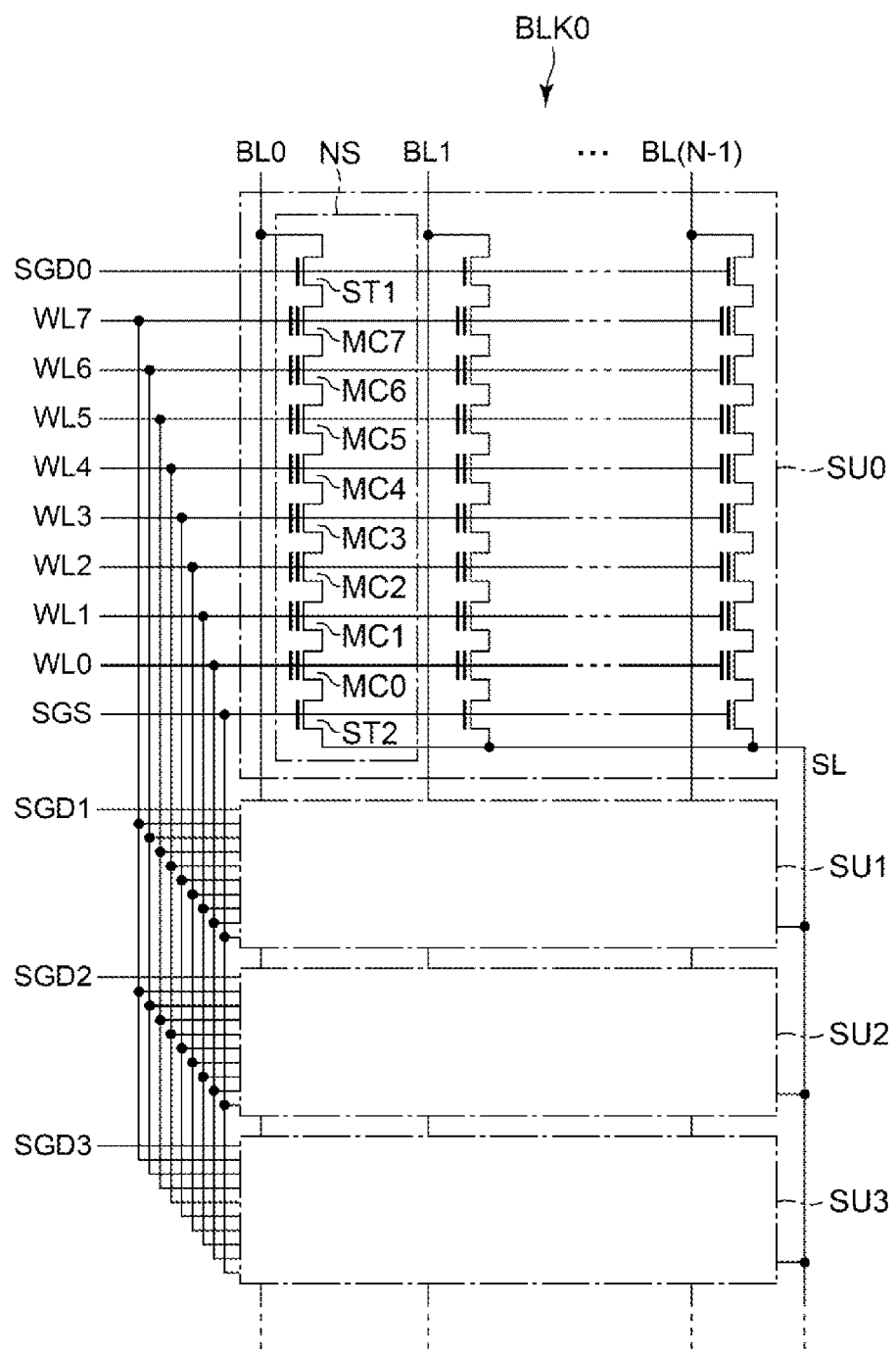
FIG. 2 shows a circuit configuration of a memory cell array.

Next, a circuit configuration of the memory cell array 10 will be described with reference to FIG. 2. In an example of FIG. 2, the block BLK0 is shown, but circuit configurations of the other blocks BLKs are the same. As shown in FIG. 2, the block BLK0 includes four string units SU0 to SU3. Each string unit SU includes a plurality of NAND strings NSs.

The NAND strings NSs are associated with bit lines BL0 to BL(N−1) (where N is an integer equal to or greater than 2), respectively. Each NAND string NS includes memory cell transistors MC0 to MC7 and select transistors ST1 and ST2.

A memory cell transistor MC includes a control gate and a charge storage layer, and is capable of storing data in a nonvolatile manner. In the description, when no particular memory cell transistors MC0 to MC7 is being referenced, any memory cell transistors can be referred to as a memory cell transistor MC. The memory cell transistor MC may be a MONOS type in which an insulating film is used in the charge storage layer, or a floating gate (FG) type in which a conductor layer is used in the charge storage layer. In the following embodiments, the MONOS type will be described as an example.

The select transistor ST1 is used to select a string unit SU in various operations. In each NAND string NS, a drain of the select transistor ST1 is connected to the associated bit line BL. A source of the select transistor ST1 is connected to one end of the memory cell transistors MC0 to MC7 connected in series. The other end of the memory cell transistors MC0 to MC7 connected in series is connected to a drain of the select transistor ST2.

In the same block BLK, sources of select transistors ST2 are connected in common to a source line SL. Gates of select transistors ST1 in each of the string units SU0 to SU3 are connected to select gate lines SGD0 to SGD3, respectively. Control gates of the memory cell transistors MC0 to MC7 are connected to word lines WL0 to WL7, respectively. Gates of the select transistors ST2 are connected to a select gate line SGS.

In the circuit configuration of the memory cell array 10 described above, the plurality of NAND strings NSs to which the same column address CA is allocated are connected to the same bit line BL. The source line SL is connected in common among the plurality of blocks BLKs.

The circuit configuration of the memory cell array 10 in the semiconductor device is not limited to the configuration described above. For example, the number of the memory cell transistors MCs in each NAND string NS and the number of the select transistors ST1 and ST2 may be any number. The number of the string units SUs in each block BLK may be any number.

Figure 3:
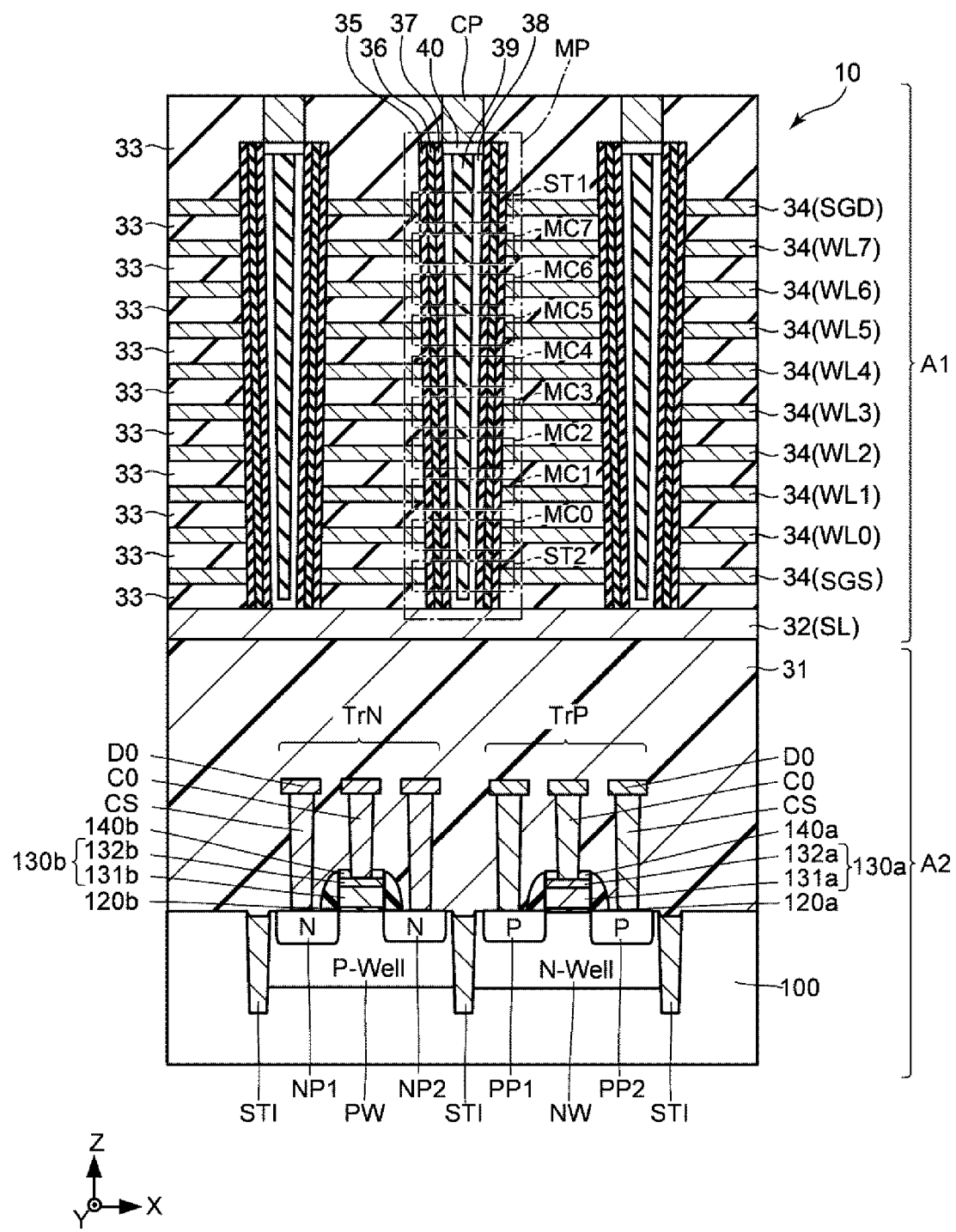
FIG. 3 shows a structure example of a semiconductor device.

Next, a cross-sectional configuration of the semiconductor device will be described with reference to FIG. 3. FIG. 3 show a structure example of the semiconductor device, and shows an X-Z cross section represented by an X axis substantially parallel to a surface (upper surface) of a semiconductor substrate 100 (semiconductor layer), a Y axis substantially perpendicular to the X axis, and a Z axis substantially perpendicular to the X axis and the Y axis. As shown in FIG. 3, an insulator layer 31 is formed on the semiconductor substrate 100. The insulator layer 31 includes silicon and oxygen, for example, silicon oxide (SiO). The memory cell array 10 is provided on the insulator layer 31. In a circuit region A2, a circuit used in the sense amplifier module 16 is formed. Although the circuit region A2 is provided below memory cell region A1 in FIG. 3, the present disclosure is not limited thereto, and the circuit region A2 may be juxtaposed with the memory cell region A1.

First, a configuration of the memory cell array 10 will be described. A conductor layer 32 functioning as the source line SL is provided on the insulator layer 31. For example, the conductor layer 32 is formed in a plate shape extending along an X-Y plane substantially parallel to the surface (upper surface) of the semiconductor substrate 100. The conductor layer 32 is formed by a conductive material such as a metal or a semiconductor material.

Eleven insulator layers 33 and ten conductor layers 34 are alternately stacked on the conductor layer 32. The insulator layers 33 include silicon and oxygen, for example, silicon oxide (SiO). The ten conductor layers 34 function as the select gate line SGS, the word lines WL0 to WL7, and the select gate line SGD in this order from the bottom. For example, the conductor layers 34 are formed in a plate shape extending in an X-axis direction. The conductor layers 34 are formed by a conductive material such as a metal material.

A plurality of memory pillars MPs that penetrate (pass through) the ten conductor layers 34 are provided and bottom surfaces of the plurality of memory pillars MPs reach the conductor layer 32. The memory pillars MPs extend along a Z-axis direction. Each memory pillar MP corresponds to one NAND string NS. The memory pillar MP includes a block insulating film 35, a charge storage layer 36, a tunnel insulating film 37, a semiconductor layer 38, a core layer 39, and a cap layer 40.

More specifically, in the fabrication of the memory pillars MP, holes corresponding to the memory pillars MPs are formed to penetrate the ten conductor layers 34 with the bottom surface of the holes reaching the conductor layer 32. The block insulating film 35, the charge storage layer 36, and the tunnel insulating film 37 are then sequentially formed on the side surface of each hole. The semiconductor layer 38 is formed such that a side surface is in contact with the tunnel insulating film 37 and a bottom surface is in contact with the conductor layer 32. The semiconductor layer 38 provides a region in which channels of the memory cell transistor MC and the select transistors ST1 and ST2 are formed. Therefore, the semiconductor layer 38 connects current paths of the select transistor ST2, the memory cell transistors MC0 to MC7, and the select transistor ST1 in series. The core layer 39 is provided in the semiconductor layer 38. The cap layer 40 having a side surface in contact with the tunnel insulating film 37 is formed on the semiconductor layer 38 and the core layer 39.

For example, silicon and oxygen, for example, silicon oxide (SiO) is used for the block insulating film 35, the tunnel insulating film 37, and the core layer 39. Silicon and nitrogen, for example, silicon nitride (SiN) is used for the charge storage layer 36. For example, polysilicon is used for the semiconductor layer 38 and the cap layer 40.

The memory pillars MPs and the eight conductor layers 34 functioning as the word lines WL0 to WL7 are combined to function as the memory cell transistors MC0 to MC7. Similarly, the memory pillars MPs and the two conductor layers 34 functioning as the select gate lines SGD and SGS are combined to function as select transistors ST1 and ST2.

A contact plug CP is formed on the cap layer 40. A conductor layer functioning as the bit line BL is formed on the contact plug CP. The contact plug CP is formed by a conductive material. A metal material is used for the conductive material, for example.

In the example of FIG. 3, three memory pillars MPs are depicted as arranged along the X-axis direction, but this is just a schematic example and additional memory pillars MPs may be optionally arranged.

The circuit region A2 includes a field effect transistor TrN and a field effect transistor TrP. The field effect transistor TrN and the field effect transistor TrP may be used, for example, in one of the various peripheral circuits such as the command register 11, the address register 12, the sequencer 13, the driver module 14, the row decoder module 15, and the sense amplifier module 16. A channel length direction of the field effect transistor TrN and the field effect transistor TrP is, for example, the X-axis direction, and a channel width direction is, for example, a Y-axis direction.

Figure 4:
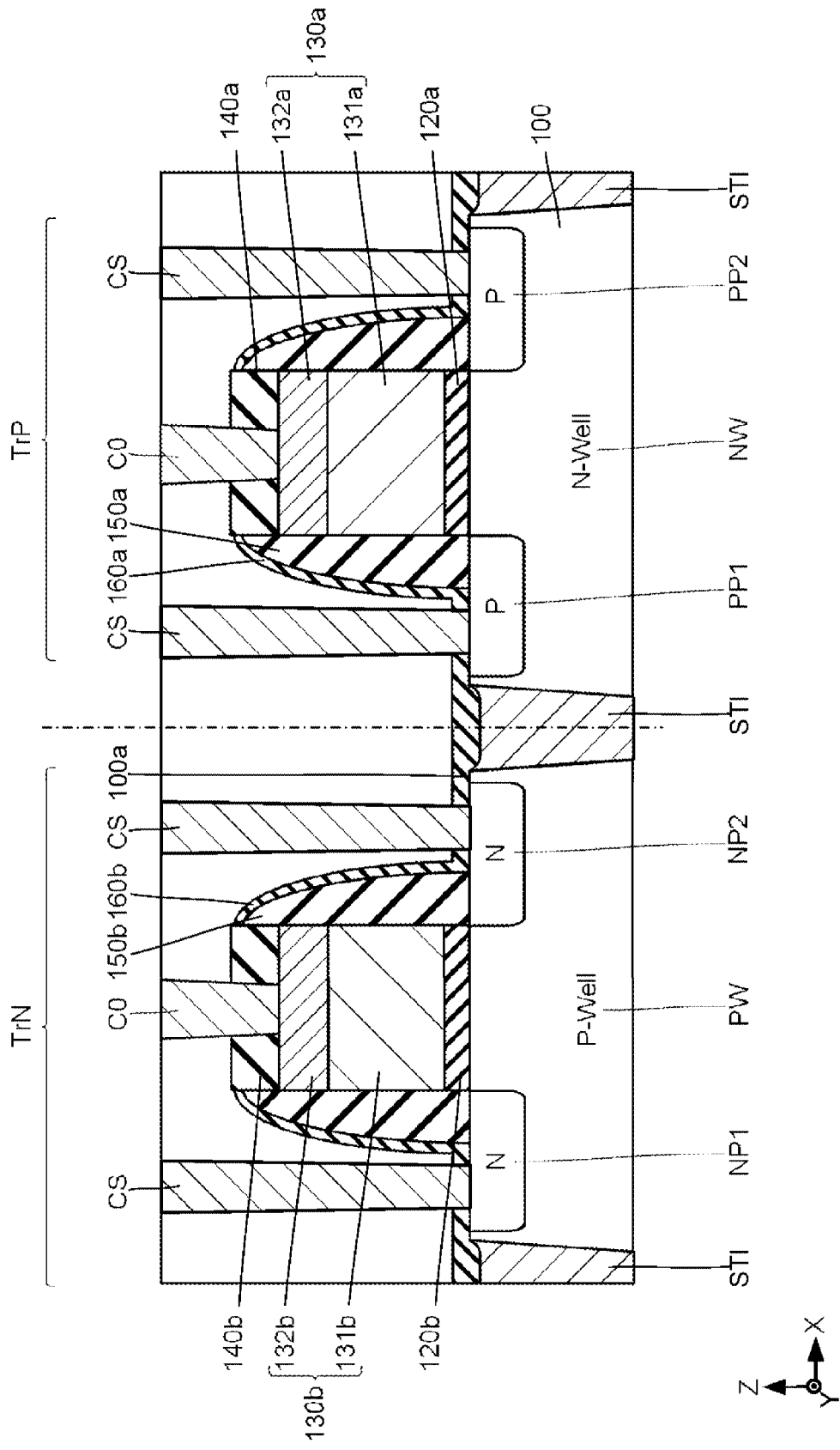
FIG. 4 is a schematic cross-sectional view showing aspects of a structure example of a semiconductor device.

A structure example of the semiconductor device including a field effect transistor TrN and a field effect transistor TrP will be described below with reference to FIG. 4. FIG. 4 is a schematic cross-sectional view showing the structure example of the semiconductor device and shows a part of an X-Z cross section. In FIG. 4, for the sake of convenience, the field effect transistor TrN and the field effect transistor TrP are depicted adjacent to each other, but the present disclosure is not limited thereto. For example, the field effect transistor TrN and the field effect transistor TrP may be arranged well apart from each other, and/or another transistor, circuit element, or the like may be provided between the field effect transistor TrN and the field effect transistor TrP. The region where the field effect transistor TrN is formed may be referred to as a TrN formation region, and a region where the field effect transistor TrP is formed may be referred to as a TrP formation region.

The field effect transistor TrN and the field effect transistor TrP are ultra-low breakdown voltage transistors for a high-speed operation, and may be applied to, for example, a logic circuit capable of low voltage driving and the high-speed operation. However, the present disclosure is not limited thereto, an example of the field effect transistor TrN may further include an ultra-high breakdown voltage transistor capable of high voltage driving or a high breakdown voltage transistor having a breakdown voltage lower than that of the ultra-high withstand voltage transistor. In the present embodiment, an example in which the field effect transistor TrN and the field effect transistor TrP are the ultra-low breakdown voltage transistors will be described as an example.

The field effect transistor TrP is provided in an N-type well region NW that is a diffusion region including an impurity element (dopant) such as phosphorus. The field effect transistor TrN is provided in a P-type well region PW that is a diffusion region including an impurity element (dopant) such as boron. The N-type well region NW and the P-type well region PW are provided on a surface 100a of the semiconductor substrate 100. The field effect transistor TrN and the field effect transistor TrP are electrically isolated from each other and/or surrounding circuit elements by an element isolation STI (shallow trench isolation feature). In the X-Z cross section, a side surface of the element isolation STI has, for example, a reverse tapered shape. The element isolation STI comprises, silicon and oxygen, for example, a silicon oxide such as undoped silicate glass (NSG). The N-type well region NW, the P-type well region PW, and the element isolation STI are provided on the surface 100a of the semiconductor substrate 100 and embedded in the semiconductor substrate 100.

The field effect transistor TrP includes a p-type impurity diffusion region PP1, a p-type impurity diffusion region PP2, an insulator layer 120a (gate insulating layer), a gate electrode 130a, an insulator layer 140a, an insulator layer 150a, and an insulator layer 160a.

The field effect transistor TrN includes an n-type impurity diffusion region NP1, an n-type impurity diffusion region NP2, an insulator layer 120b (gate insulating layer), a gate electrode 130b, an insulator layer 140b, an insulator layer 150b, and an insulator layer 160b.

The semiconductor device shown in FIG. 4 further includes contact plugs CS and contact plugs C0. The contact plug CS is a conductor layer electrically connected to either one of a source or a drain of the field effect transistor TrP or the field effect transistor TrN. The contact plug C0 is a conductor layer electrically connected to a gate electrode 130a of the field effect transistor TrP or the gate electrode 130b of the field effect transistor TrN. The p-type impurity diffusion region PP1 and the p-type impurity diffusion region PP2, and the n-type impurity diffusion region NP1 and the n-type impurity diffusion region NP2 are electrically connected to different conductor layers via respective contact plugs CS provided thereon. The gate electrode 130a and the gate electrode 130b are electrically connected to different conductor layers via respective contact plugs C0 provided thereon.

The p-type impurity diffusion region PP1 and the p-type impurity diffusion region PP2 are formed on a surface (upper surface) of the N-type well region NW and contain, for example, doped boron (B). The p-type impurity diffusion region PP1 is disposed apart from the p-type impurity diffusion region PP2 in the X-axis direction.

The p-type impurity diffusion region PP1 and the p-type impurity diffusion region PP2 function as the source (source diffusion layer) and the drain (drain diffusion layer) of the field effect transistor TrP.

The n-type impurity diffusion region NP1 and the n-type impurity diffusion region NP2 are formed on a surface (upper surface) of the p-type well region PW, and contain, for example, doped phosphorus (P). The n-type impurity diffusion region NP1 is disposed spaced apart from the n-type impurity diffusion region NP2 in the X-axis direction.

The n-type impurity diffusion region NP1 and the n-type impurity diffusion region NP2 function as the source (source diffusion layer) and the drain (drain diffusion layer) of the field effect transistor TrN.

The insulator layer 120a is provided on the N-type well region NW between the p-type impurity diffusion region PP1 and the p-type impurity diffusion region PP2, and functions as a gate insulating film of the field effect transistor TrP.

The insulator layer 120b is provided on the P-type well region PW between the n-type impurity diffusion region NP1 and the n-type impurity diffusion region NP2, and functions as a gate insulating film of the field effect transistor TrN.

The insulator layer 120a and the insulator layer 120b comprise an insulating material such as silicon and oxygen, for example, silicon oxide or silicon and nitrogen, for example, silicon nitride.

The gate electrode 130a is provided on the insulator layer 120a. The gate electrode 130a includes a semiconductor layer 131a and a conductor layer 132a.

The gate electrode 130b is provided on the insulator layer 120b. The gate electrode 130b includes a semiconductor layer 131b and a conductor layer 132b.

The semiconductor layer 131a and the semiconductor layer 131b are provided on the insulator layer 120a and the insulator layer 120b, respectively. An example of the semiconductor layer 131a includes a polysilicon layer doped with an impurity such as boron (B). An example of the semiconductor layer 131b includes a polysilicon layer doped with an impurity such as phosphorus (P). By including the impurity such as boron or phosphorus in the semiconductor layer 131a and the semiconductor layer 131b, threshold voltages of the field effect transistor TrP and the field effect transistor TrN can be adjusted.

The conductor layer 132a and the conductor layer 132b are provided on the semiconductor layer 131a and the semiconductor layer 131b, respectively. The conductor layer 132a and the conductor layer 132b comprise, for example, a metal material such as titanium (Ti), tungsten (W) or tungsten silicide (WSi). The conductor layer 132a and the conductor layer 132b may be a stack of conductor layers.

The insulator layer 140a and the insulator layer 140b are provided on the conductor layer 132a and the conductor layer 132b, respectively. The insulator layer 140a and the insulator layer 140b comprise, for example, silicon and nitrogen, for example, silicon nitride. The insulator layer 140a and the insulator layer 140b can function as etching stoppers (etch stop layers) when the contact plugs C0 are being formed. One contact plug C0 is provided on the conductor layer 132a and penetrates the insulator layer 140a. Another contact plug C0 is provided on the conductor layer 132b and penetrates the insulator layer 140b.

The insulator layer 150a is provided on the N-type well region NW and surrounds the gate electrode 130a in the X-Y plane. The insulator layer 150a is provided on a side surface of a stack of layers (also referred to as agate stack) including the insulator layer 120a, the gate electrode 130a, and the insulator layer 140a. The insulator layer 150b is provided on the P-type well region PW and surrounds the gate electrode 130b in the X-Y plane. The insulator layer 150b is provided on a side surface of a stack of layers (also referred to as a gate stack) including the insulator layer 120b, the gate electrode 130b, and the insulator layer 140b. The insulator layer 150a and the insulator layer 150b comprise, for example, silicon and oxygen, for example, silicon oxide. The insulator layer 150a and the insulator layer 150b function as respective sidewalls (also referred to as gate spacers) of the field effect transistor TrP and the field effect transistor TrN.

The insulator layer 160a is provided on the insulator layer 150a and the upper surface of the adjacent element isolations STI. The insulator layer 160b is similarly provided on the insulator layer 150b and the adjacent element isolations STI. The insulator layer 160a and the insulator layer 160b comprise silicon and nitrogen, for example, silicon nitride and may be formed at the same time as a continuous film. The insulator layer 160a and the insulator layer 160b function as respective outer sidewalls of the field effect transistor TrP and the field effect transistor TrN.

Figure 5:
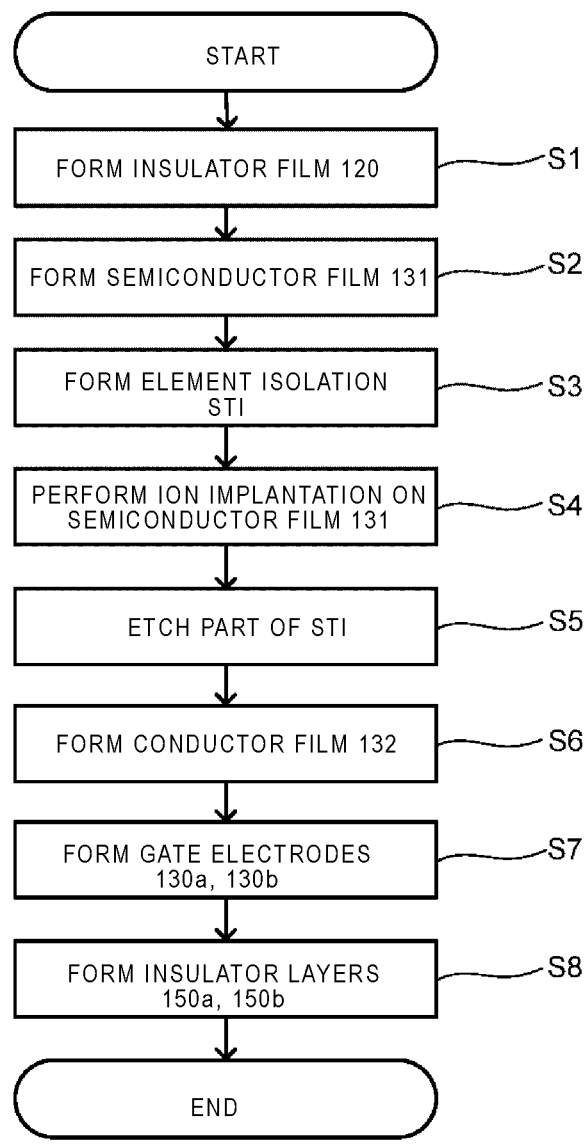
FIG. 5 is a flowchart showing aspects of a method for manufacturing a semiconductor device.

Next, an example of a series of manufacturing processes related to formation of a gate electrode of a field effect transistor in the semiconductor device shown in FIG. 4 will be described with reference to FIG. 5. FIG. 5 is a flowchart showing an example of a method for manufacturing a semiconductor device according to an embodiment. Each of FIGS. 6 to 23 depict an example of a structure during different stages of manufacturing the semiconductor device according to the method of FIG. 5.

In the description, when an insulator film 120 is formed over the TrP formation region and the TrN formation region in a manufacturing, different portions of the insulator film 120 in the TrP formation region and the TrN formation region may be considered as the insulator layer 120a and the insulator layer 120b. In other words, when fabrication of both the insulator layer 120a and the insulator layer 120b is being described, "insulator film 120" is used. Such a description method is also used for other reference numerals throughout the present specification.

Figure 6:
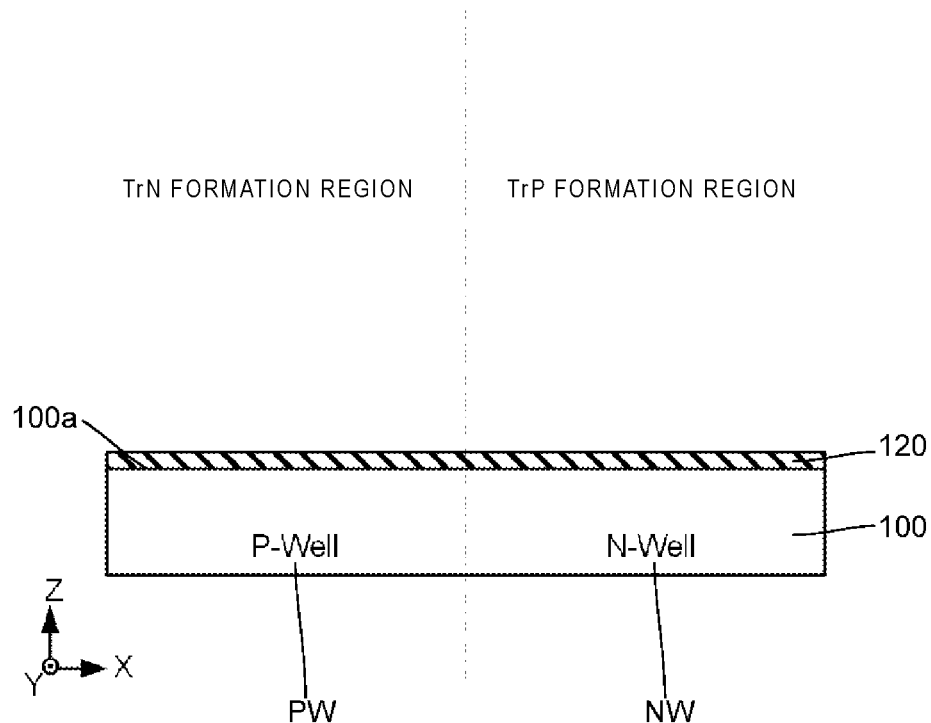
FIG. 6 through FIG. 23 show aspects related to manufacturing of a semiconductor device.

First, as shown in FIG. 6, the insulator film 120 is formed on the N-type well region NW and the P-type well region PW of the semiconductor substrate 100 (step S1).

Figure 7:
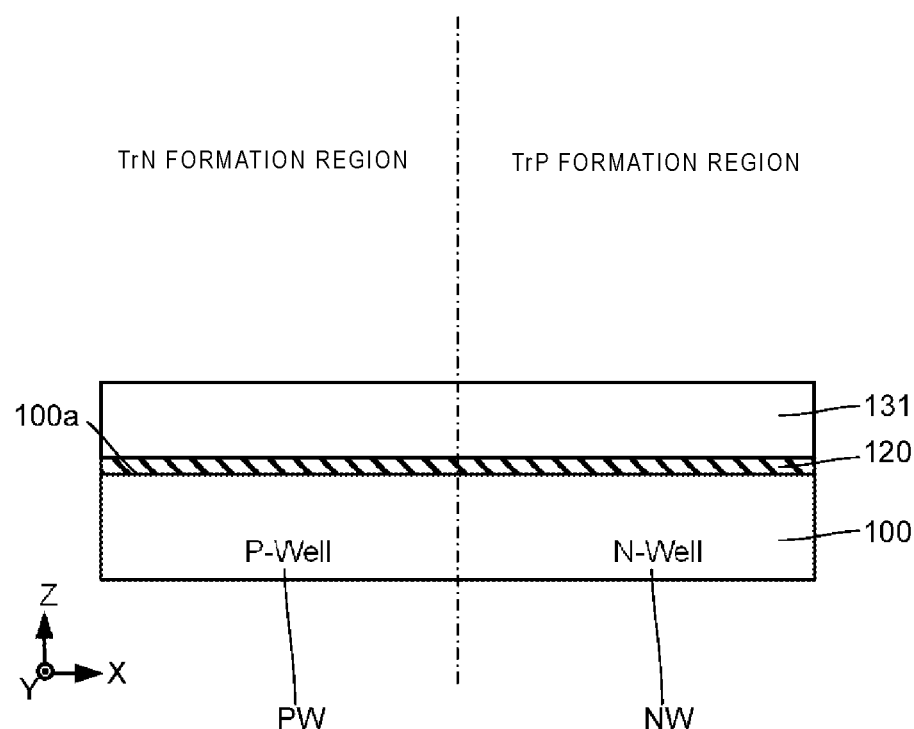

Next, as shown in FIG. 7, a semiconductor film 131 is formed on the insulator film 120 (step S2). The semiconductor film 131 may be formed by, for example, depositing undoped polysilicon.

Figure 8:
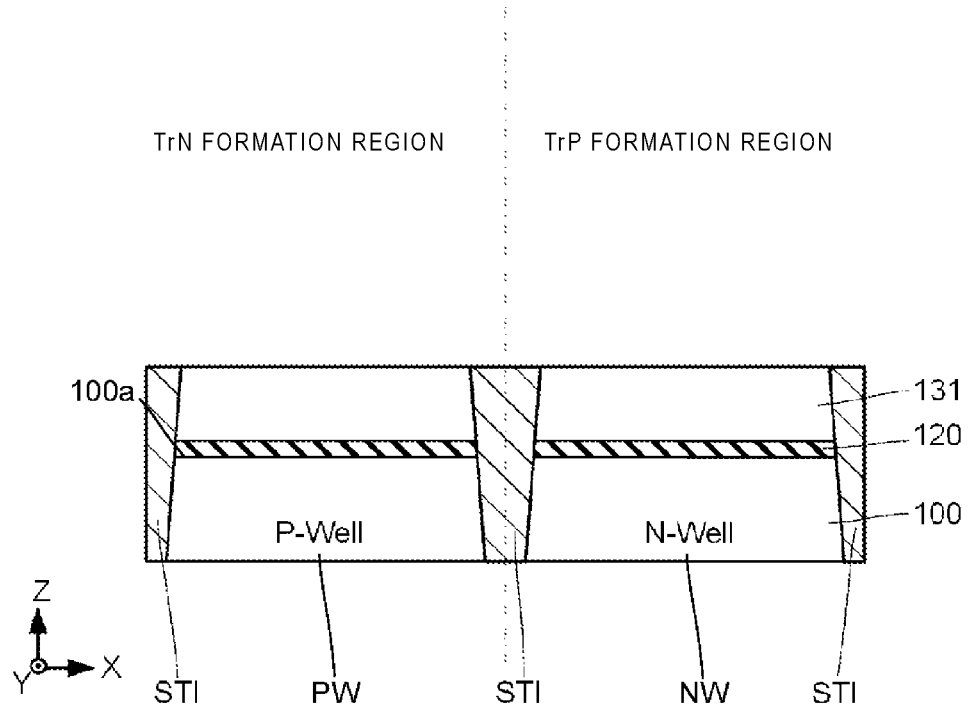

Next, as shown in FIG. 8, the element isolation STI is embedded in the semiconductor substrate 100 and the semiconductor film 131 to surround the diffusion region in the X-Y plane (step S3). Specifically, in the fabrication process a region in which the element isolation STI is to be formed is removed by, for example, using a photolithography process and etching, and then embedding (filling) the insulating material into the removed region (e.g., a shallow trench). The etching in this process is, for example, reactive ion etching (RIE). The element isolation STI separates previously formed layers into the TrP formation region and the TrN formation region.

Figure 9:
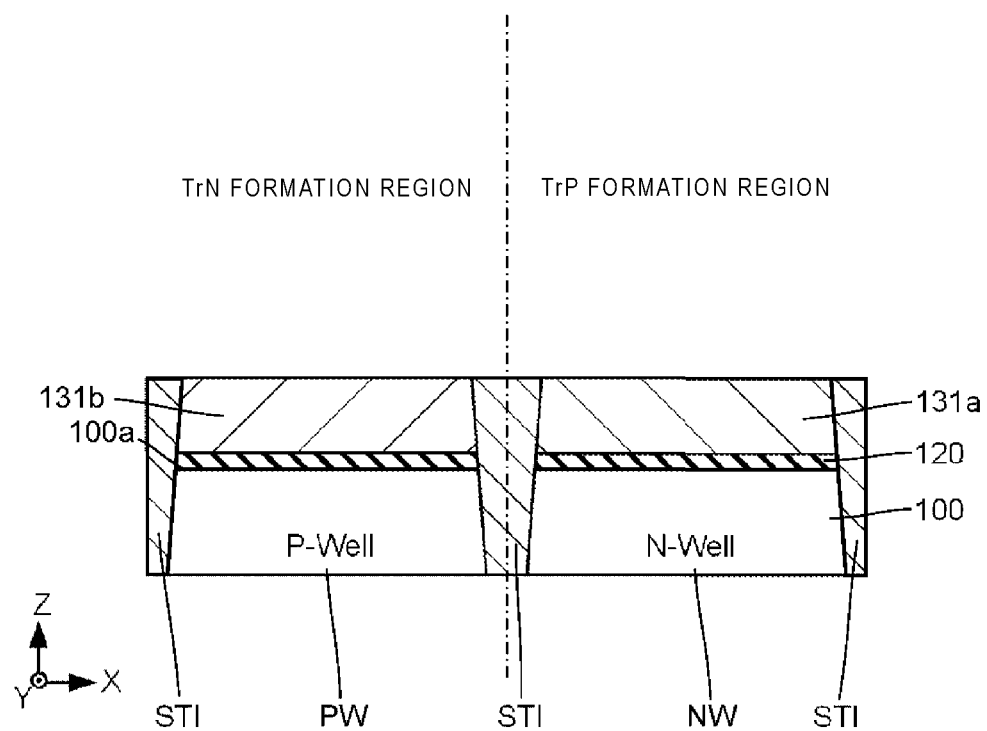

Next, as shown in FIG. 9, the semiconductor layer 131a and the semiconductor layer 131b are formed (step S4). Specifically, while the portion of the semiconductor layer 131 in TrN formation region is covered with a mask, an exposed part of the semiconductor film 131 is doped with boron by ion implantation so that the semiconductor layer 131a is formed. Then while the TrP formation region is covered with a mask, the part of the semiconductor film 131 in the TrN formation region is doped with phosphorus by ion implantation so that the semiconductor layer 131b is formed.

Figure 10:
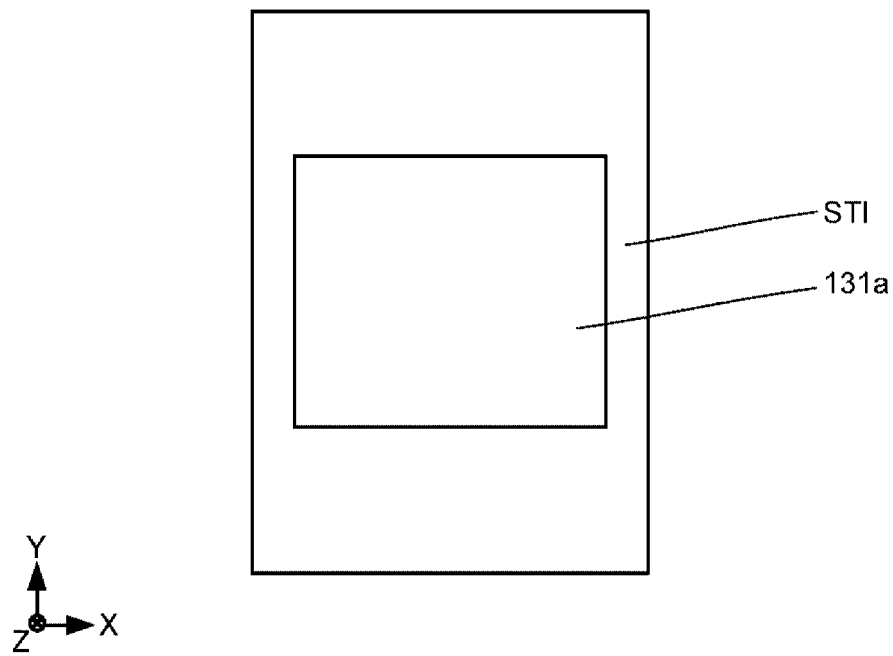
Figure 11:
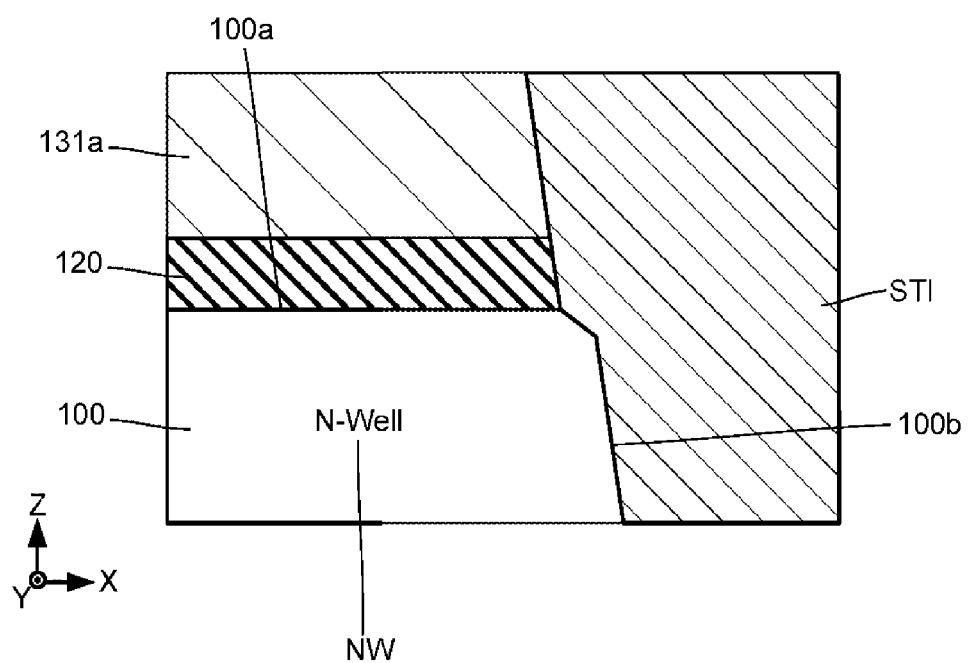

FIG. 10 shows a part of the TrP formation region in the X-Y plane in step S4. FIG. 11 shows a part of an X-Z cross section including an interface 100b between the N-type well region NW and the element isolation STI in step S4. The element isolation STI surrounds the N-type well region NW in the X-Y plane. As shown in FIG. 11, the element isolation STI is in contact with the N-type well region NW, the insulator film 120, and the semiconductor layer 131a. Likewise, in the TrN formation region, the element isolation STI may surround the P-type well region PW in the X-Y plane and be in contact with the P-type well region PW, the insulator film 120, and the semiconductor layer 131b.

Figure 12:
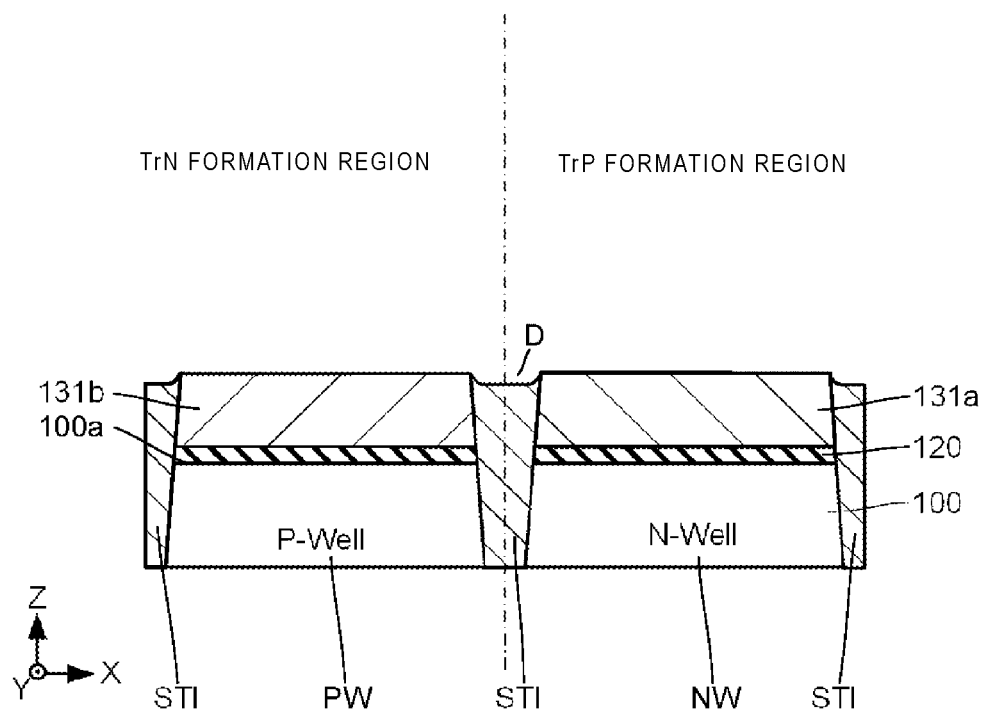
Figure 13:
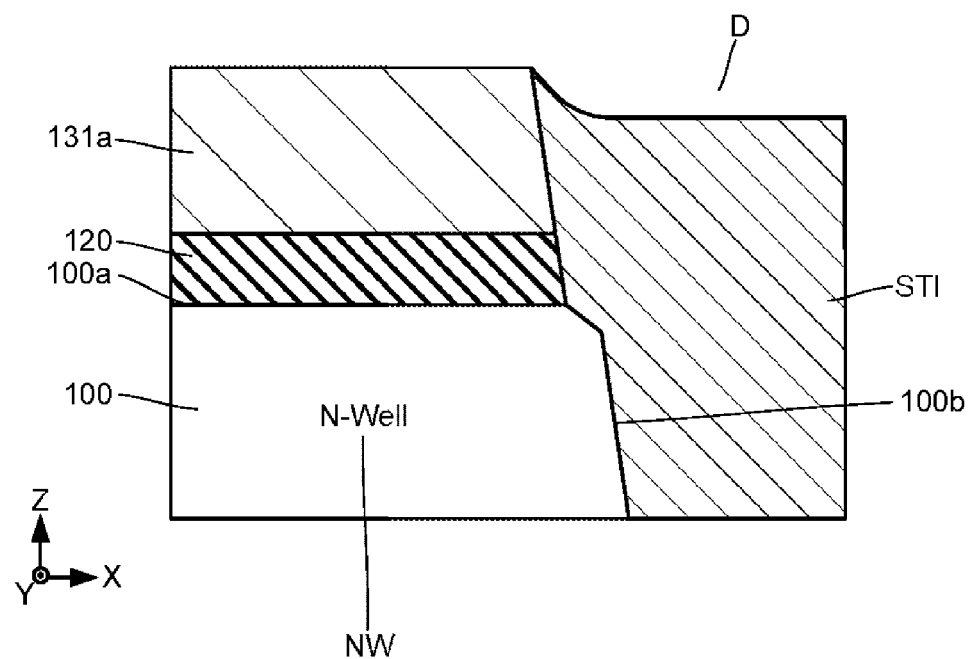

Next, as shown in FIG. 12, a recess D is formed in the location of element isolation STI by removing an upper part of the element isolation STI (step S5). This part of the element isolation STI may be removed by, for example, wet etching using hydrofluoric acid (e.g., dilute hydrofluoric acid). FIG. 13 shows the X-Z cross section depicting more specifically the interface 100b between the N-type well region NW and the element isolation STI after the processing in step S5. The depth of the recess D is not particularly limited as long as a bottom surface of the recess D is at a position higher than the surface 100a of the semiconductor substrate 100.

Figure 14:
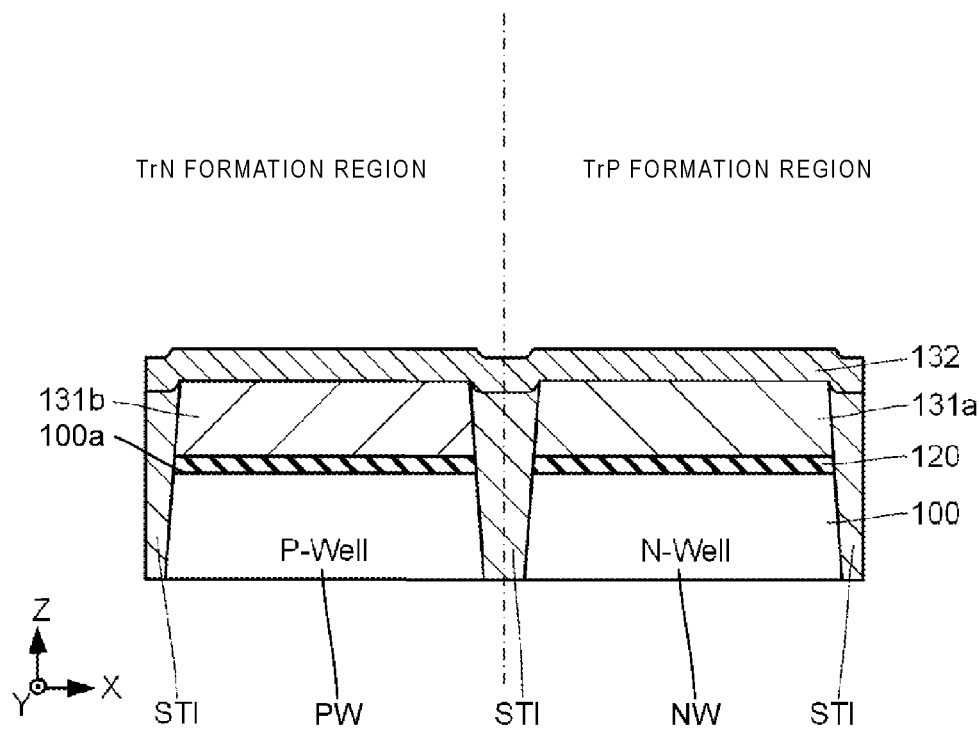
Figure 15:
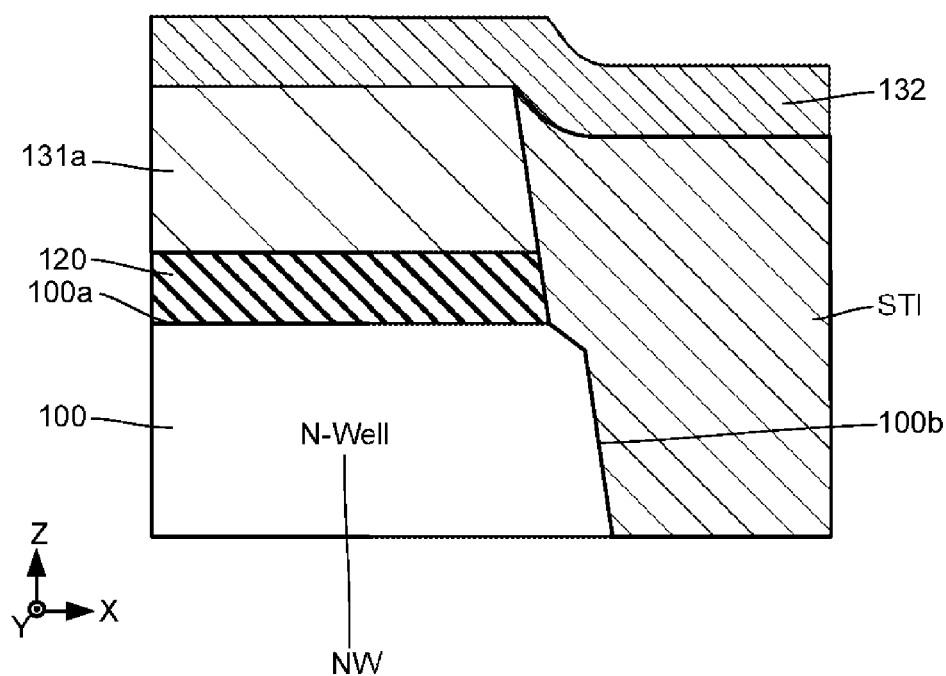

Next, as shown in FIG. 14, a conductor film 132 is formed (step S6). Specifically, the conductor film 132 is formed on the semiconductor layer 131a, the semiconductor layer 131b, and the element isolation STI. FIG. 15 shows the X-Z cross section including the interface 100b between the N-type well region NW and the element isolation STI in the X-axis direction. The conductor film 132 may be formed by, for example, sputtering.

Figure 16:
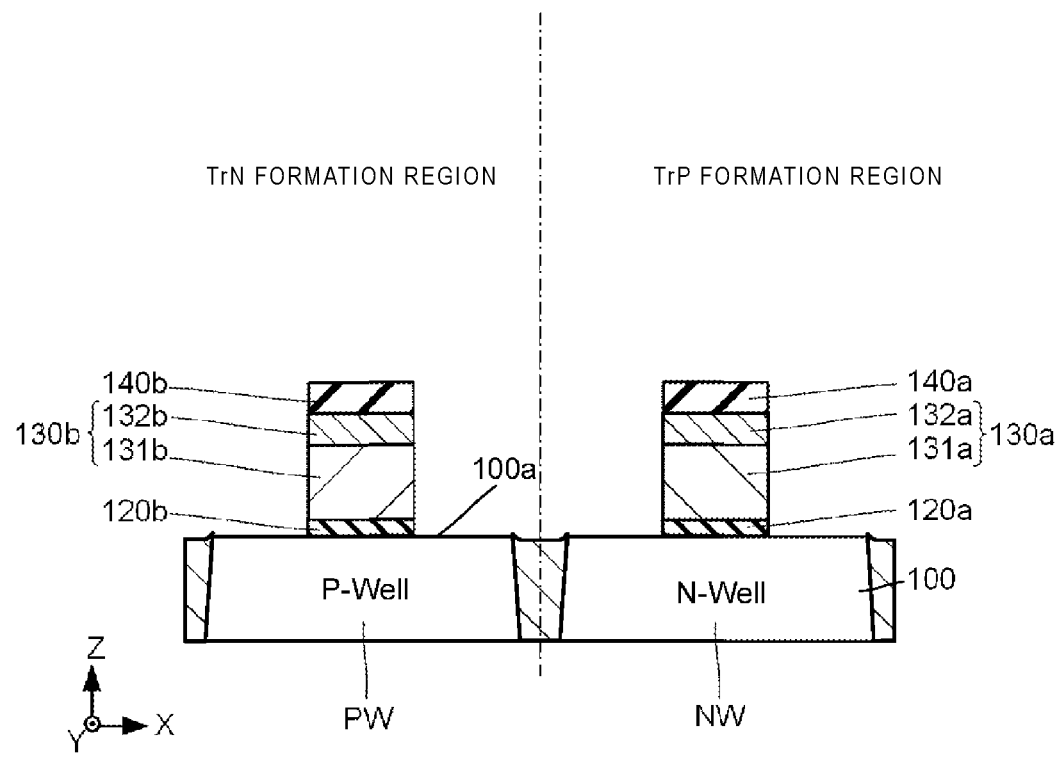

Next, as shown in FIG. 16, after the insulator film 140 is formed on the conductor film 132, a part of the semiconductor film 131 and a part of the conductor film 132 are removed, and the gate electrode 130a and the gate electrode 130b are thus formed (step S7). Specifically, the parts of conductor film 132 on the element isolation STI and the portions of the layer stacked on the semiconductor substrate 100 adjacent to the element isolation STI but outside of the gate electrode regions are removed by etching. The layers stacked on the semiconductor substrate 100 are thus separated into the TrP formation region and the TrN formation region. As a result of these processes, the insulator layer 120a, the insulator layer 120b, the gate electrode 130a, the gate electrode 130b, the insulator layer 140a, and the insulator layer 140b are formed. The etching in this process is, for example, the RIE, and the RIE may be performed a plurality of times under different conditions to remove the various layers of the layer stack on the semiconductor substrate 100.

Figure 17:
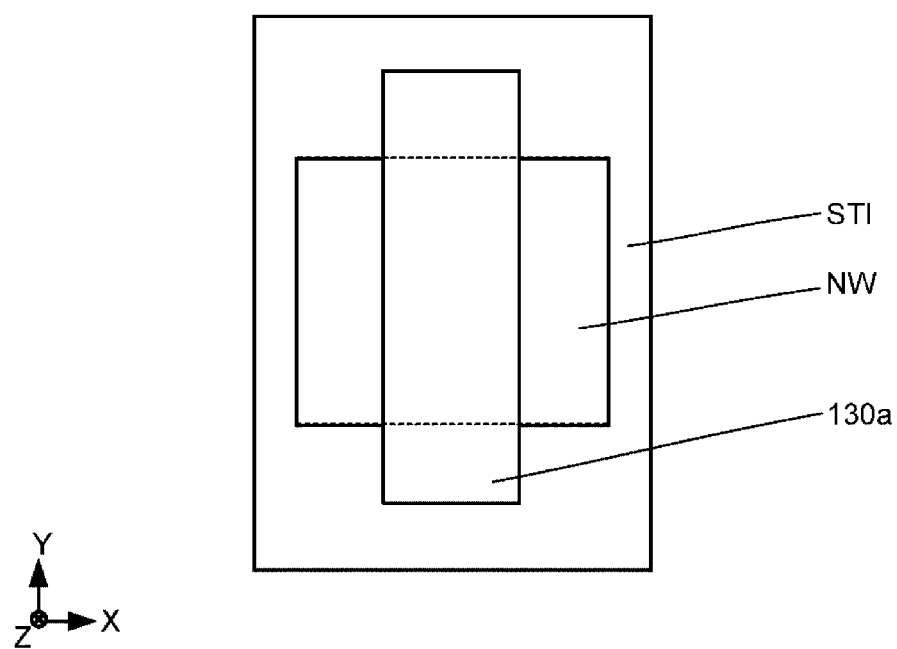
Figure 18:
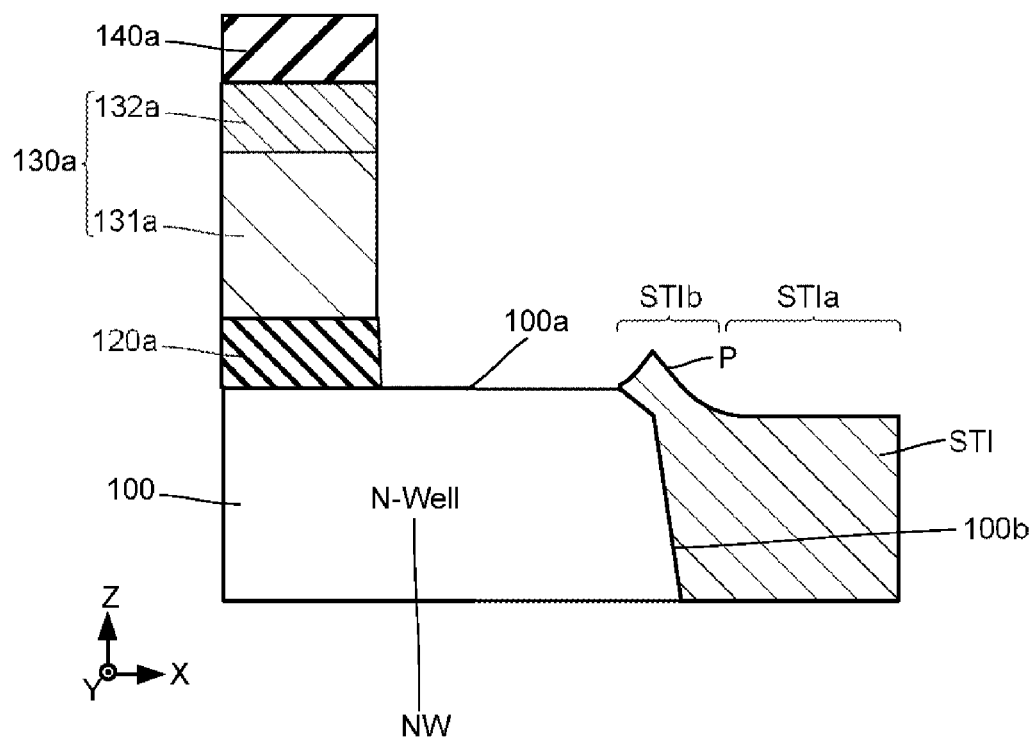

FIG. 17 shows a part of the TrP formation region in the X-Y plane in step S7. FIG. 18 shows a part of the X-Z cross section including the interface 100b between the N-type well region NW of the TrP formation region and the adjacent element isolation STI in the X-axis direction. For the sake of depictional convenience, the insulator layer 140a is omitted in FIG. 17. In step S7, as shown in FIG. 18, a region STIa and a region STIb are formed in the element isolation STI.

The region STIa is recessed below the surface 100a of the semiconductor substrate 100. The region STIb is provided between the region STIa and the N-type well region NW. The region STIb includes a convex portion P protruding above the region STIa with respect to the surface 100a. FIG. 18 shows an example in which the convex portion P protrudes above the surface 100a. The region STIb preferably extends to an end portion of the surface (upper surface) of the N-type well region NW. When the region STIa and the region STIb are similarly formed adjacent to the TrN formation region, the region STIb is between the region STIa and the P-type well region PW. It is preferable that the region STIb also extends to an end portion of the surface (upper surface) of the P-type well region PW. That is, the structure of element isolation STI adjacent to the P-type well region PW can be symmetric with the structure of element isolation STI adjacent to the N-type well region NW.

Figure 19:
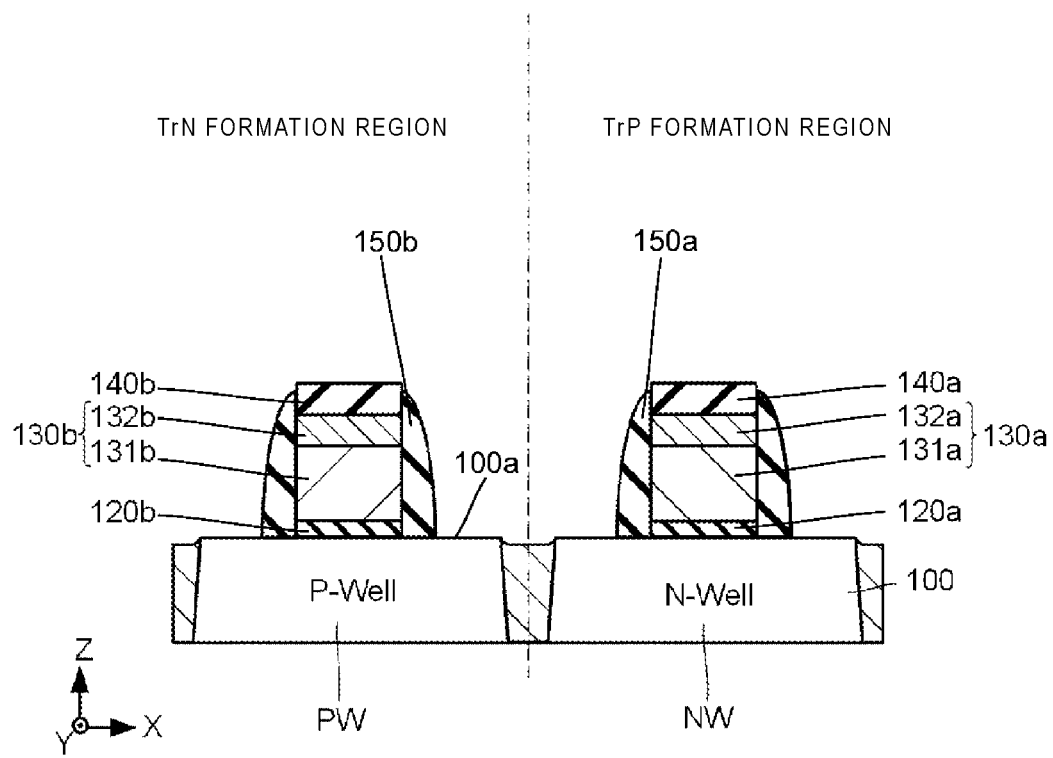

Next, as shown in FIG. 19, the insulator layer 150a and the insulator layer 150b are formed (step S8). The insulator layer 150a and the insulator layer 150b may be formed by providing an insulating film covering the N-type well region NW and the P-type well region PW and then removing a part of the insulating film by etching.

Figure 20:
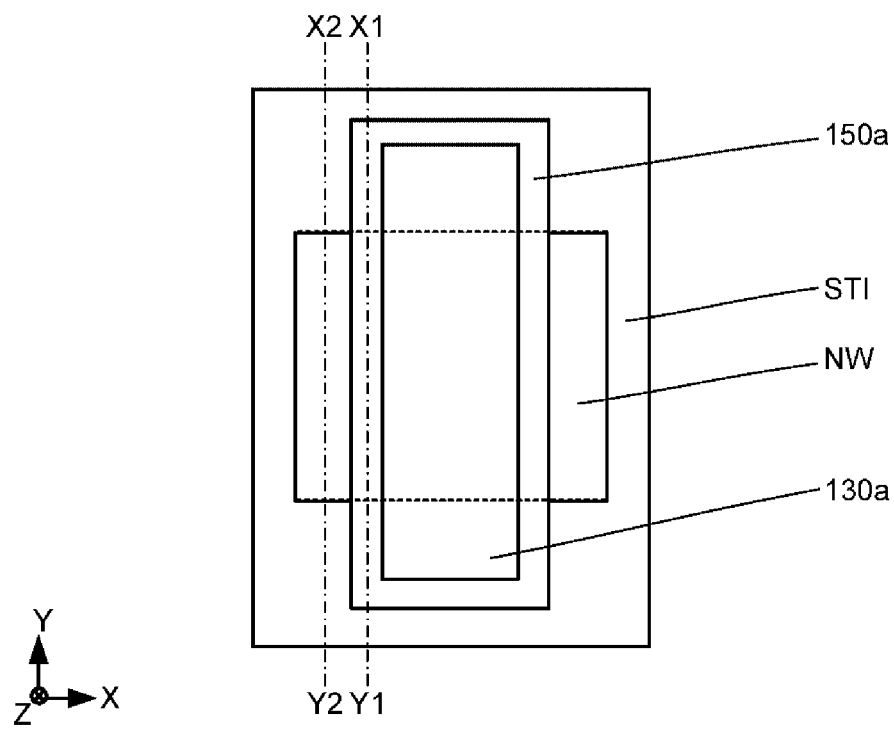
Figure 21:
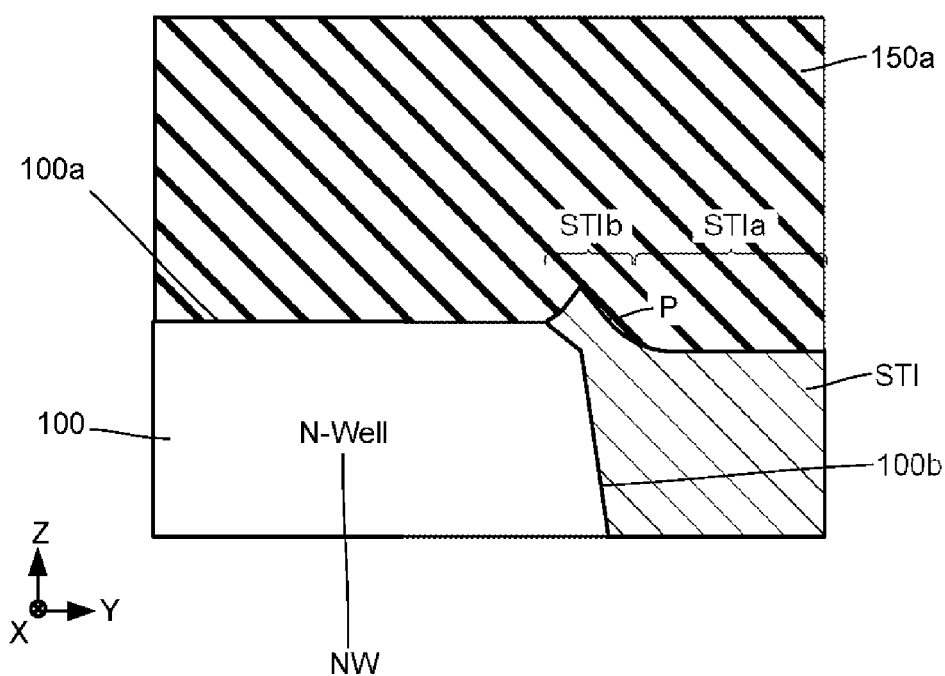
Figure 22:
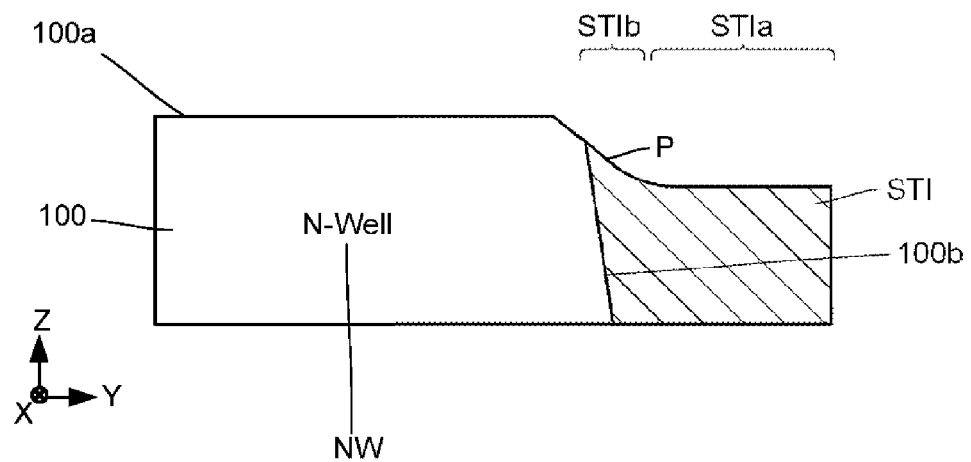

FIG. 20 shows a part of the TrP formation region in the X-Y plane in step S8. FIG. 21 shows a part of a Y-Z cross section including the interface 100b between the N-type well region NW and the element isolation STI at the line X1-Y1 of FIG. 20. FIG. 22 shows a part of the Y-Z cross section including the interface 100b between the N-type well region NW and the element isolation STI at the line X2-Y2 of FIG. 20. For the sake of convenience, the insulator layer 140a is omitted in FIG. 20.

Thus, in step S8, the region STIb is provided below the insulator layer 150a in the Y-Z cross section at the line X1-Y1, as shown in FIG. 21. Furthermore, as shown in FIG. 22, the region STIb not under the insulating film 150a is processed such that the convex portion P is now recessed below the surface 100a of the semiconductor substrate 100 in the Y-Z cross section at the line X2-Y2.

Figure 23:
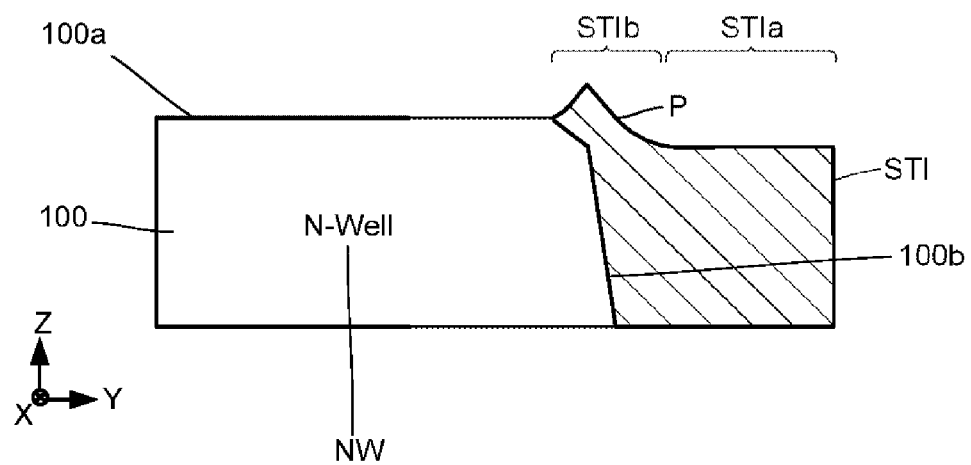

The shape of the region STIb in the Y-Z cross section at the line X2-Y2 is not limited to a shape shown in FIG. 22. FIG. 23 shows another example of a part of the Y-Z cross section including the interface 100b between the N-type well region NW and the element isolation STI at the line X2-Y2 of FIG. 20. In the region STIb shown in FIG. 23, the convex portion P may remain protruding above the surface 100a in the Y-Z cross section at the line X2-Y2.

After step S8, the n-type impurity diffusion region NP1, the n-type impurity diffusion region NP2, the p-type impurity diffusion region PP1, the p-type impurity diffusion region PP2, the insulator layer 160a, the insulator layer 160b, the contact plug CS, and the contact plug C0 are formed.

The manufacturing processes described above are merely examples and other processes may be utilized. Likewise, the specific order of the manufacturing processes may be changed in some instances.

In the method described above, the recess D is formed in the element isolation STI before the conductor film 132 is formed.

Figure 24:
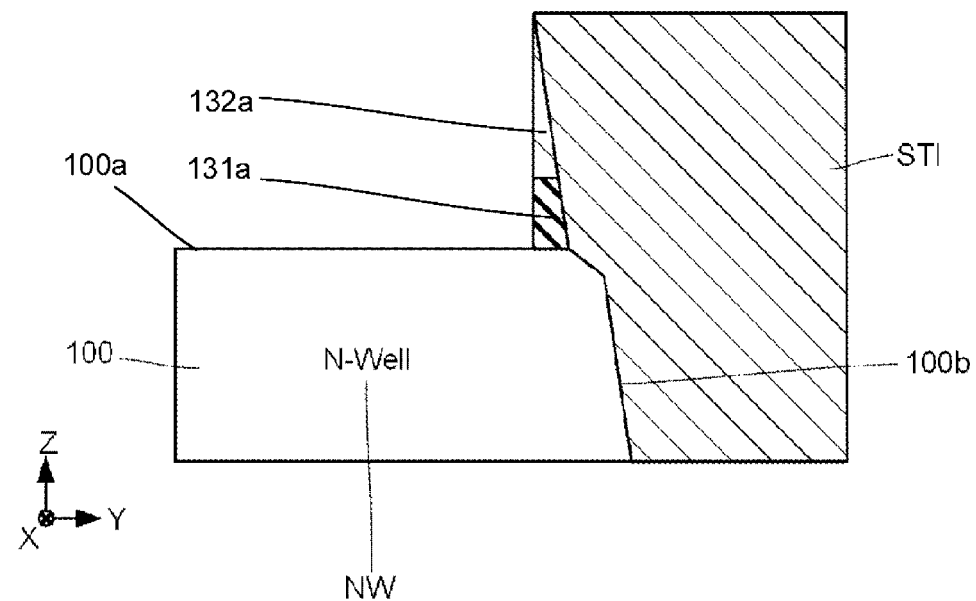
FIG. 24 is a schematic view showing aspects related to a method for manufacturing a comparative semiconductor device in which a recess D is not formed in an element isolation STI.

FIG. 24 is a schematic view showing a comparative method of manufacturing a semiconductor device in which the recess D is not formed in the element isolation STI. FIG. 24 shows a part of the Y-Z cross section including the interface 100b between the N-type well region NW and the element isolation STI in the Y-axis direction.

The side surface of the element isolation STI in the Y-axis direction has a reverse tapered shape. Therefore, if no recess D is formed, then when a part of the semiconductor layer 131a, a part of the semiconductor layer 131b, and a part of the conductor film 132 are removed in step S7, a part of the semiconductor layer 131a overlapping the element isolation STI along the Z-axis direction is likely to remain, as depicted in FIG. 24, in the vicinity of the interface 100b in the Y-Z cross section at the line X2-Y2 of FIG. 20. The remaining portion can be a reason for a leak current of the field effect transistor thus formed. The remaining portion may be formed in the vicinity of the interface 100b along the X-axis direction. Similarly, some part of the semiconductor layer 131b may remain in the vicinity of the interface between the P-type well region PW and the element isolation STI in the X-axis direction or the Y-axis direction.

On the other hand, by forming the recess D in the element isolation STI before the conductor film 132 is formed, it is possible to prevent the leaving of a part of the semiconductor layer 131a or the semiconductor layer 131b in the vicinity of the interface 100b after step S7. Therefore, the leak current of the field effect transistors TrP, TrN can be reduced or eliminated and a semiconductor device having high reliability can be provided.

Figure 25:
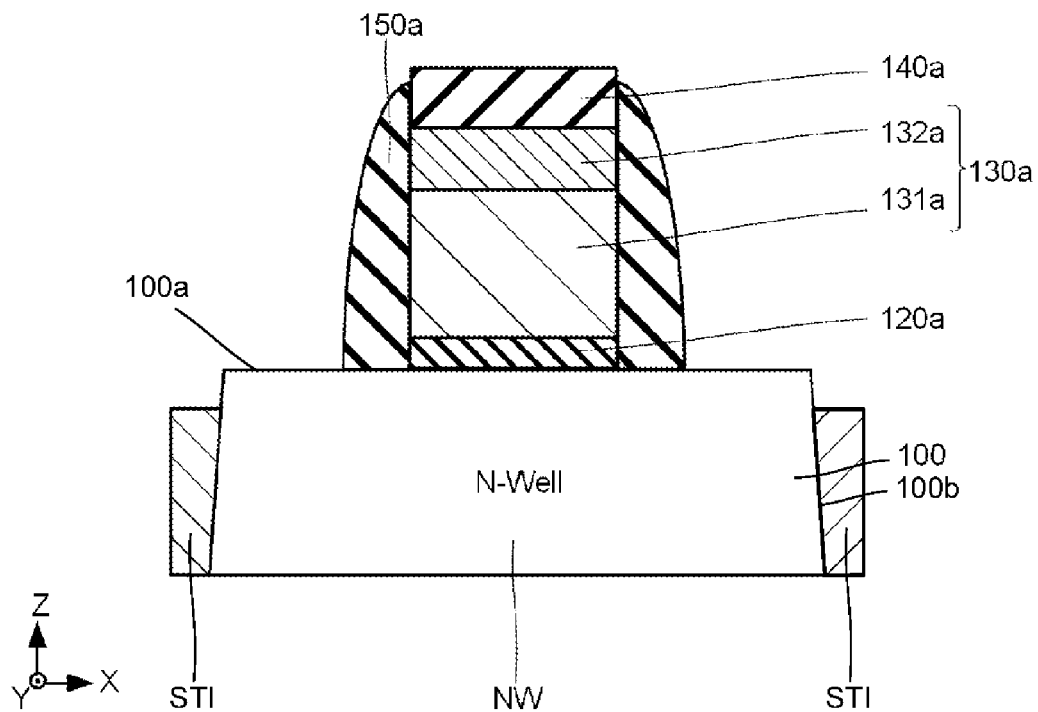
FIG. 25 is a schematic view showing aspects related to a method for manufacturing a comparative semiconductor device in which a region STIa and a region STIb are not formed.

Furthermore, in the method for manufacturing, the region STIa and the region STIb are formed in the element isolation STI. The region STIb extends to the end portion of the surface (upper surface) of the N-type well region NW and/or the P-type well region PW. However, FIG. 25 is a schematic view showing a method for manufacturing a semiconductor device in which neither the region STIa nor the region STIb is formed in the element isolation STI. FIG. 25 shows a part of the X-Z cross section including the interface 100b between the N-type well region NW and the element isolation STI in the X-axis direction of a comparative example.

When neither the region STIa nor the region STIb is formed as depicted in FIG. 25 in step S8, then a part of the side surface of the N-type well region NW is left exposed. Similarly, a part of the side surface of the P-type well region PW is also left exposed. Therefore, when an impurity element such as phosphorus or boron is implanted to form the n-type impurity diffusion region NP1, the n-type impurity diffusion region NP2, the p-type impurity diffusion region PP1, or the p-type impurity diffusion region PP2, the impurity element will also be implanted into a portion of the interface 100b. This would cause or increase the leak current of the field effect transistor so fabricated.

On the other hand, by forming the region STIa and the region STIb, it is possible to prevent the exposure of any part of the side surface of the N-type well region NW or the P-type well region PW in step S8. Therefore, it is possible to prevent or limit the leak current of the resulting field effect transistor and to provide a semiconductor device having high reliability.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first region including a memory cell; and
a second region including a peripheral circuit, wherein the second region includes:
a diffusion region at a surface of a semiconductor layer,
a gate insulating film on a surface of the diffusion region,
a gate electrode on the gate insulating film,
an element isolation region embedded in the semiconductor layer and surrounding the diffusion region,
a gate spacer insulator on the surface of the diffusion region, the element isolation region, and a sidewall surface of the gate electrode, the gate spacer insulator surrounding the gate electrode, and
the element isolation region having an upper surface that includes:
a first portion recessed to a level lower than the surface of the diffusion region, and
a second portion between the diffusion region and the first portion and including a protrusion protruding to a level greater than the level of the first portion.

2. The semiconductor device according to claim 1, wherein the protrusion protrudes to a level higher than the surface of the diffusion region.

3. The semiconductor device according to claim 2, wherein the element isolation region overlaps a portion of the diffusion region.

4. The semiconductor device according to claim 1, wherein the element isolation region overlaps a sidewall portion of the diffusion region.

5. The semiconductor device according to claim 1, wherein the protrusion directly contacts the gate spacer insulator.

6. The semiconductor device according to claim 5, wherein the protrusion protrudes to a level higher than the surface of the diffusion region.

7. The semiconductor device according to claim 1, wherein the second portion of the upper surface of the element isolation region overlaps an outer edge of the diffusion region.

8. A storage device, comprising:
a semiconductor layer;
a plurality memory cells on the semiconductor layer in a first region; and
a peripheral circuit formed on the semiconductor layer in a second region that is adjacent to the first region in a first direction, wherein
the peripheral circuit includes a transistor comprising:
a well region at a surface of the semiconductor layer;
a gate insulating film on a surface of the well region;
a gate electrode on the gate insulating film;
an element isolation structure embedded in the semiconductor layer and surrounding the well region; and
a gate spacer insulator on the surface of the well region, the element isolation structure, and a sidewall surface of the gate electrode, the gate spacer insulator surrounding the gate electrode, wherein the element isolation structure has an upper surface that includes:
a first portion recessed to a level lower than the surface of the well region, and
a second portion between the well region and the first portion and including a protrusion protruding to a level greater than the level of the first portion.

9. The storage device according to claim 8, wherein the protrusion protrudes to a level higher than the surface of the well region.

10. The storage device according to claim 9, wherein the element isolation structure overlaps a portion of the well region.

11. The storage device according to claim 8, wherein the element isolation structure overlaps a sidewall portion of the well region.

12. The storage device according to claim 8, wherein the protrusion directly contacts the gate spacer insulator.

13. The storage device according to claim 12, wherein the protrusion protrudes to a level higher than the surface of the well region.

14. The storage device according to claim 8, wherein the second portion of the upper surface of the element isolation structure overlaps to the surface of the well region.

15. The storage device according to claim 8, wherein the well region is doped with p-type dopants.

16. The storage device according to claim 8, wherein the well region is doped with n-type dopants.

17. A method of manufacturing a semiconductor device, the method comprising:
- forming an insulating film on an upper surface of diffusion region that is in a semiconductor layer;
- forming a semiconductor film on the insulating film;
- forming an element isolation structure extending through the semiconductor film and insulating film into the semiconductor layer, the element isolation structure surrounding the diffusion region;
- forming a recess in an upper surface of the element isolation structure by removing a part of the element isolation structure;
- forming a conductive film on the semiconductor film and the recessed upper surface of the element isolation structure;
- forming a gate electrode by removing portions of the insulating film, the semiconductor film, and the conductive film; and
- forming a gate spacer insulator on the upper surface of the diffusion region to surround the gate electrode, the gate spacer insulator directly contacting the element isolation structure and being on a sidewall surface of the gate electrode, wherein
- in forming the gate electrode, a first region of the element isolation structure is recessed to be lower than the upper surface of the diffusion region and a second region of the element isolation structure includes a protruding portion that protrudes to a level higher than the upper surface of the diffusion region, the second region being between the first region and the diffusion region and directly adjacent to the diffusion region.

18. The method according to claim 17, wherein the protruding portion directly contacts the gate spacer insulator.

19. The method according to claim 17, wherein the element isolation structure overlaps the upper surface of the diffusion region.

20. The method according to claim 17, wherein the element isolation structure directly contacts the upper surface of the diffusion region.

* * * * *